(12) United States Patent
Sundararajan et al.

(10) Patent No.: US 10,373,860 B2
(45) Date of Patent: Aug. 6, 2019

(54) BATCH PROCESSING APPARATUS

(71) Applicant: APPLIED MATERIALS, INC., Santa Clara, CA (US)

(72) Inventors: Mukund Sundararajan, Bangalore (IN); Ananthkrishna Jupudi, Singapore (SG); Manjunatha Koppa, Karnataka (IN); Saket Rathi, Rajasthan (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 471 days.

(21) Appl. No.: 14/788,127

(22) Filed: Jun. 30, 2015

(65) Prior Publication Data

US 2017/0004982 A1  Jan. 5, 2017

(51) Int. Cl.
*F26B 3/30* (2006.01)
*F26B 13/10* (2006.01)
*H01L 21/687* (2006.01)

(52) U.S. Cl.
CPC .. *H01L 21/68785* (2013.01); *H01L 21/68742* (2013.01); *H01L 21/68764* (2013.01)

(58) Field of Classification Search
CPC ..... H01L 21/683; H01L 21/6835–6838; H01L 21/687–68707; H01L 21/68714; H01L 21/68721; H01L 21/68742; H01L 21/6875; H01L 21/68757; H01L 21/68764; H01L 21/68771; H01L 21/68785

USPC .................. 219/443.1–444.1; 392/416, 418; 414/935–941

See application file for complete search history.

(56) References Cited

U.S. PATENT DOCUMENTS

| | | | | |
|---|---|---|---|---|
| 3,674,612 | A * | 7/1972 | Gehl, Jr. | A47G 33/06 248/27.8 |
| 5,607,009 | A * | 3/1997 | Turner | C03C 17/002 118/725 |
| 6,309,163 | B1 * | 10/2001 | Nering | G03F 7/7075 414/331.01 |
| 9,214,369 | B2 * | 12/2015 | Vopat | H01L 21/67201 |
| 2004/0047720 | A1 * | 3/2004 | Lerner | H01L 21/68 414/781 |
| 2011/0027052 | A1 * | 2/2011 | Ozawa | H01L 21/6734 414/217 |
| 2015/0204606 | A1 | 7/2015 | Kutney | |
| 2016/0095166 | A1 | 3/2016 | Miller | |

* cited by examiner

*Primary Examiner* — Sang Y Paik
(74) *Attorney, Agent, or Firm* — Moser Taboada; Alan Taboada

(57) ABSTRACT

Embodiments of batch processing apparatus and collapsible substrate support are provided herein. In some embodiments, a collapsible substrate support includes a base linearly moveable between a first position and a second position; and a first plurality of substrate support elements coupled to the base and including a lowermost substrate support element disposed in a fixed position with respect to the base and an uppermost substrate support element disposed above the lowermost substrate support element, wherein the uppermost substrate support element is linearly movable between a first position nearer to the lowermost substrate support element and a second position further from the lowermost substrate support element.

20 Claims, 4 Drawing Sheets

US 10,373,860 B2

BATCH PROCESSING APPARATUS

FIELD

Embodiments of the present disclosure generally relate to substrate processing equipment.

BACKGROUND

The effectiveness of a substrate fabrication process is often measured by two factors, which are device yield and the cost of ownership (COO). These factors directly affect the cost to produce an electronic device and thus a device manufacturer's competitiveness in the market place. The COO, while affected by a number of factors, is greatly affected by the number of substrates processed per hour and cost of processing materials. Batch processing has been introduced to reduce COO and is very effective because processing multiple substrates saves time. However, batch processing apparatuses occupy a large amount of valuable space in a fab.

Conventional batch processing apparatuses include a plurality of vertically spaced apart supports that are moved vertically to align one of the supports with an opening in the apparatus for placement or removal of a substrate. During processing, a specified spacing between each support is necessary. As such, the height of a batch processing apparatus is twice the product of the number of supports and the spacing between each support.

Therefore, the inventors have provided an improved batch processing apparatus for use with integrated fabrication systems.

SUMMARY

Embodiments of batch processing apparatus and collapsible substrate support are provided herein. In some embodiments, a collapsible substrate support includes a base linearly moveable between a first position and a second position; and a first plurality of substrate support elements coupled to the base and including a lowermost substrate support element disposed in a fixed position with respect to the base and an uppermost substrate support element disposed above the lowermost substrate support element, wherein the uppermost substrate support element is linearly movable between a first position nearer to the lowermost substrate support element and a second position further from the lowermost substrate support element.

In some embodiments, a collapsible substrate support includes a base coupled to a lift mechanism via a shaft extending through a floor of a batch processing chamber, wherein the base is moveable between a processing position and a transfer position; a first plurality of concentric tubular elements, wherein a first outermost tubular element is coupled to the base, wherein each of the first plurality of concentric tubular elements radially inward of the first outermost tubular element extends through an adjacent one of the first plurality of concentric tubular elements, and wherein a first innermost tubular element includes a first continuous upper surface; a second plurality of concentric tubular elements, wherein a second outermost tubular element is coupled to the base, wherein each of the second plurality of concentric tubular elements radially inward of the second outermost tubular element extends through an adjacent one of the second plurality of concentric tubular elements, and wherein a second innermost tubular element includes a second continuous upper surface; a first pin extending through the base and into the first innermost tubular element; and a second pin extending through the base and into the second innermost tubular element, wherein each of the first and second pluralities of concentric tubular elements includes support prongs disposed on an upper surface to support a substrate.

In some embodiments, an apparatus for batch processing including a body having a floor and sidewalls defining a processing volume; and a collapsible substrate support disposed within the body. The collapsible substrate support includes a base linearly moveable between a first position and a second position; and a first plurality of substrate support elements coupled to the base and including a lowermost substrate support element disposed in a fixed position with respect to the base and an uppermost substrate support element disposed above the lowermost substrate support element, wherein the uppermost substrate support element is linearly movable between a first position nearer to the lowermost substrate support element and a second position further from the lowermost substrate support element.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
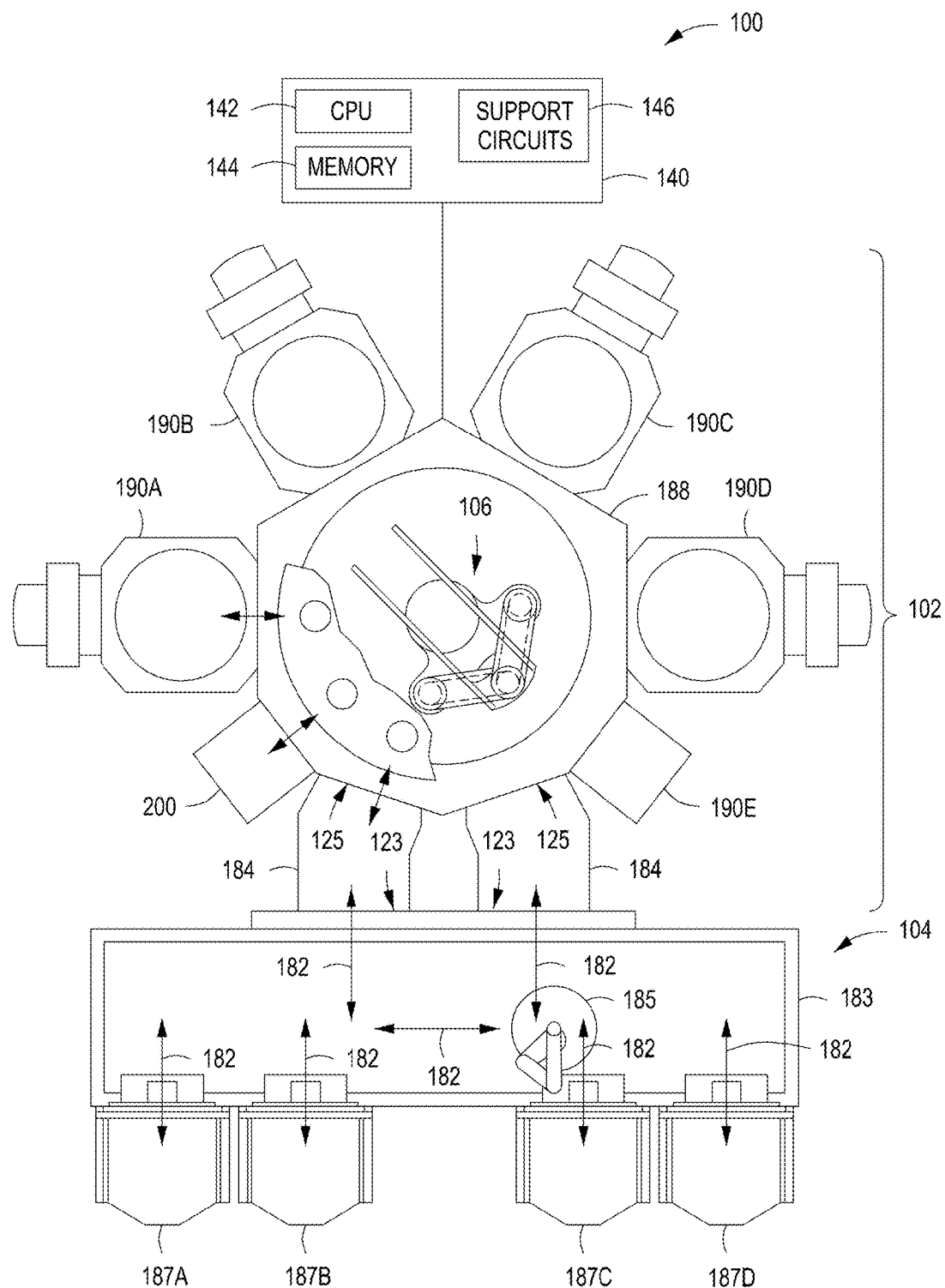
FIG. 1 is a processing system suitable for use with a batch processing apparatus in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure generally relate to batch process apparatus having a collapsible substrate support. Because the inventive substrate support is collapsible, the inventive batch processing apparatus advantageously reduces the footprint of the batch treatment apparatus while maintaining the ability to process multiple substrates simultaneously. Embodiments of the inventive batch processing apparatus may advantageously mount directly to a transfer chamber of a substrate processing tool and simultaneously process multiple substrates while reducing the footprint of the batch processing apparatus when compared to conventional batch processing apparatuses. For example, the batch processing apparatus may be used to perform processes such as curing, microwave curing, degas, heating, cooling, epitaxial deposition, atomic layer deposition (ALD), chemical vapor deposition (CVD), etching, or other processes that may be advantageously performed in a batch process.

FIG. 1 is a schematic top-view diagram of an exemplary multi-chamber processing system 100 having a batch processing apparatus as disclosed herein. Examples of suitable multi-chamber processing systems that may be suitably modified in accordance with the teachings provided herein include the ENDURA®, CENTURA®, and PRODUCER® processing systems or other suitable processing systems commercially available from Applied Materials, Inc., located in Santa Clara, Calif. Other processing systems (including those from other manufacturers) may be adapted to benefit from the disclosure. Although described in connection with a multi-chamber processing system herein, the batch processing apparatus may also be a stand-alone processing chamber.

In some embodiments, the multi-chamber processing system 100 may generally comprise a vacuum-tight processing platform 102, a factory interface 104, and a system controller 140. The processing platform 102 may include a plurality of process chambers 190A-E and at least one load-lock chamber (two shown) 184 that are coupled to a transfer chamber 188. A transfer robot 106 (described below with respect to FIGS. 2 and 3) is centrally disposed in the transfer chamber 188 to transfer substrates between the load lock chambers 184 and the process chambers 190A-E. The process chambers 190A-E may be configured to perform various functions including layer deposition including atomic layer deposition (ALD), chemical vapor deposition (CVD), physical vapor deposition (PVD), etch, pre-clean, de-gas, orientation and center-finding, annealing, and other substrate processes Each of the process chambers 190A-E may include a slit valve or other selectively sealable opening to selectively fluidly couple the respective inner volumes of the process chambers 190A-E to the inner volume of the transfer chamber 188. Similarly, each load lock chamber 184 may include a port to selectively fluidly couple the respective inner volumes of the load lock chambers 184 to the inner volume of the transfer chamber 188. In some embodiments, a batch processing apparatus 200 may be coupled to the transfer chamber 188, as shown in FIG. 1, to enable processing (heating, cooling, treating, curing, deposition, etching, etc.) of the substrates. Although the batch processing apparatus 200 is depicted as coupled to the transfer chamber 188, in some embodiments, the batch processing apparatus may alternatively be coupled to the factory interface 104.

The factory interface 104 is coupled to the transfer chamber 188 via the load lock chambers 184. In some embodiments, each of the load lock chambers 184 may include a first port 123 coupled to the factory interface 104 and a second port 125 coupled to the transfer chamber 188. The load lock chambers 184 may be coupled to a pressure control system which pumps down and vents the load lock chambers 184 to facilitate passing the substrate between the vacuum environment of the transfer chamber 188 and the substantially ambient (e.g., atmospheric) environment of the factory interface 104.

In some embodiments, the factory interface 104 comprises at least one docking station 183 and at least one factory interface robot 185 (one shown) to facilitate transfer of substrates from the factory interface 104 to the processing platform 102 for processing through the load lock chambers 184. The docking station 183 is configured to accept one or more (four shown) front opening unified pods (FOUPs) 187A-D. Optionally, one or more metrology stations (not shown) may be coupled to the factory interface 104 to facilitate measurement of the substrate from the FOUPs 187A-D. The factory interface robot 185 disposed in the factory interface 104 is capable of linear and rotational movement (arrows 182) to shuttle cassettes of substrates between the load lock chambers 184 and the one or more FOUPs 187A-D.

Figure 2:
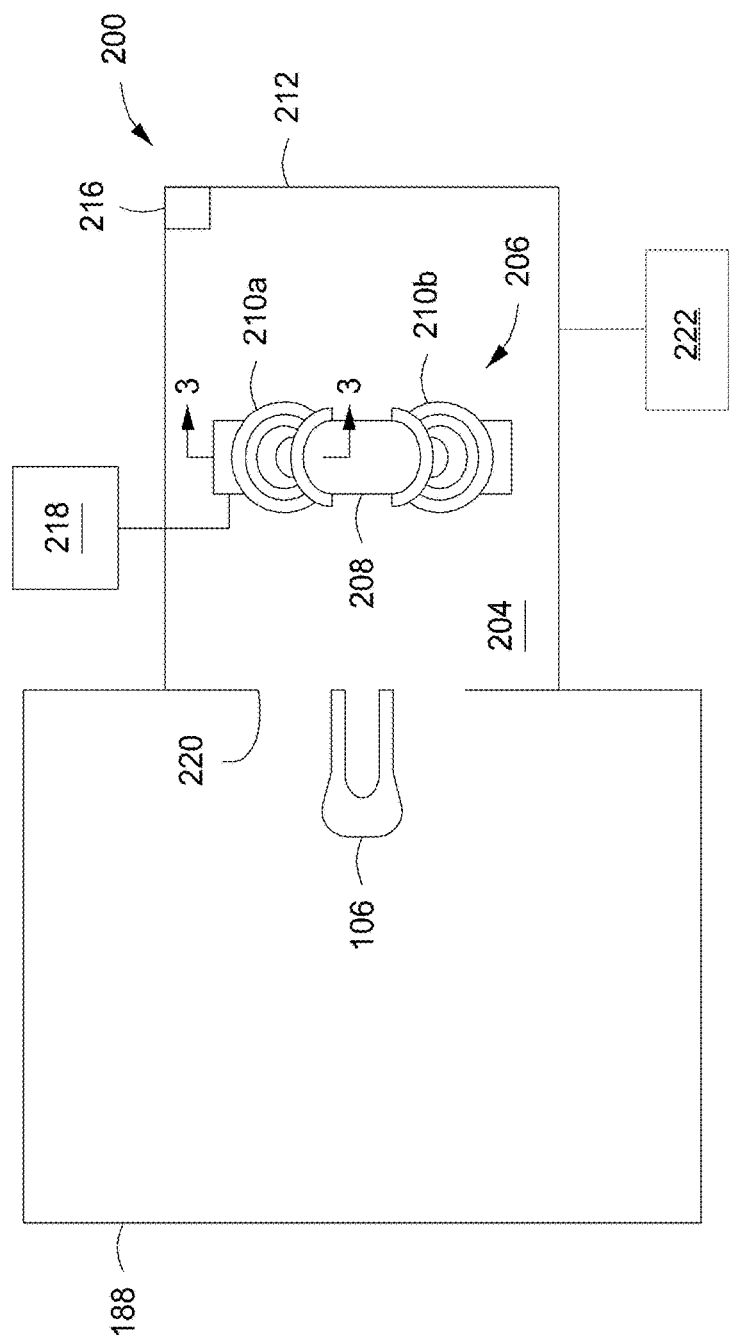
FIG. 2 is a schematic top view of a batch processing apparatus in accordance with some embodiments of the present disclosure.

FIG. 2 illustrates a schematic top view of the batch processing apparatus 200 in accordance with some embodiments of the present disclosure. The batch processing apparatus 200 includes a body having a floor 312 (shown in FIGS. 3A and 3B), sidewalls 212, and a ceiling (not shown) that define a processing volume 204 within. An opening 220 (e.g., a slit valve) is formed in the sidewall 212 through which the transfer robot 106 extends to place or remove a substrate from the batch processing apparatus 200. The batch processing apparatus 200 further includes a collapsible substrate support 206 and, in some embodiments, a radiative heat source 216 to heat the processing volume 204, and, in some embodiments, a coolant source 218 fluidly coupled to the collapsible substrate support 206. The batch processing apparatus 200 may also include various support systems 222, dependent upon the process to be performed in the batch processing apparatus 200. Examples of support systems 222 include, but are not limited to, gas supplies (e.g., to provide process gases, purge gases, or the like), pumping systems (e.g., to remove process byproducts, maintain process pressures, and the like), process controllers (e.g., to control process parameters for processing in the batch processing apparatus 200), energy sources (e.g., RF or microwave power supplies and applicators to provide energy into the processing volume of the batch processing apparatus 200), and/or other resources to perform a desired batch process.

Embodiments of the present disclosure provide flexibility to adjust the overall batch height efficiently within the limited space of the processing volume of the batch processing apparatus. The collapsible substrate support 206 allows the shrinking of the batch substrate stack height during transfer and expansion during processing. Thus, the number of substrates batched vertically in the available chamber height is advantageously increased, which further advantageously increase the overall throughput. Alternatively, for a given number of substrates in a batch, the height of the chamber can be reduced. The batch substrate stack height in the available chamber height is reduced from $2 \times (N \times A)$ to $(N \times A)+(N \times B)$, where N=number of substrates in a batch, A=substrate to substrate spacing while processing (e.g., more than 10 mm), and B=substrate to substrate spacing during substrate transfer (e.g., standard 10 mm, as in a front opening unified pod, or FOUP). Thus, $N \times A$=total batch stack height during processing, and $N \times B$=total batch stack height during substrate transfer.

In some embodiments, the collapsible substrate support 206 includes a first plurality of concentric tubular elements 210a and a second plurality of concentric tubular elements 210b disposed on a base 208. The collapsible substrate support 206 is moveable between a processing position (FIG. 3A) and a transfer position (FIG. 3B), which will be described below. The collapsible substrate support 206 includes a first plurality of substrate support elements coupled to the base 208 and including a lowermost substrate support element disposed in a fixed position with respect to the base 208 and an uppermost substrate support element disposed above the lowermost substrate support element. The uppermost substrate support element is linearly movable between a first position nearer to the lowermost substrate support element and a second position further from the lowermost substrate support element.

Figure 3A:
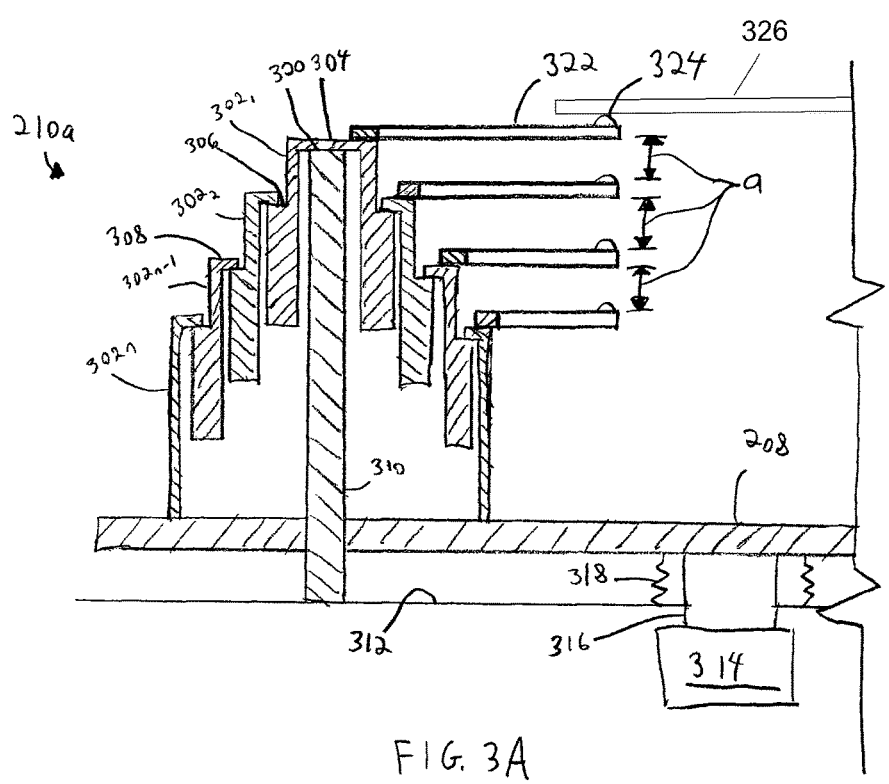
FIG. 3a is a cross-sectional view of a collapsible substrate support in a processing position in accordance with some embodiments of the present disclosure.
Figure 3B:
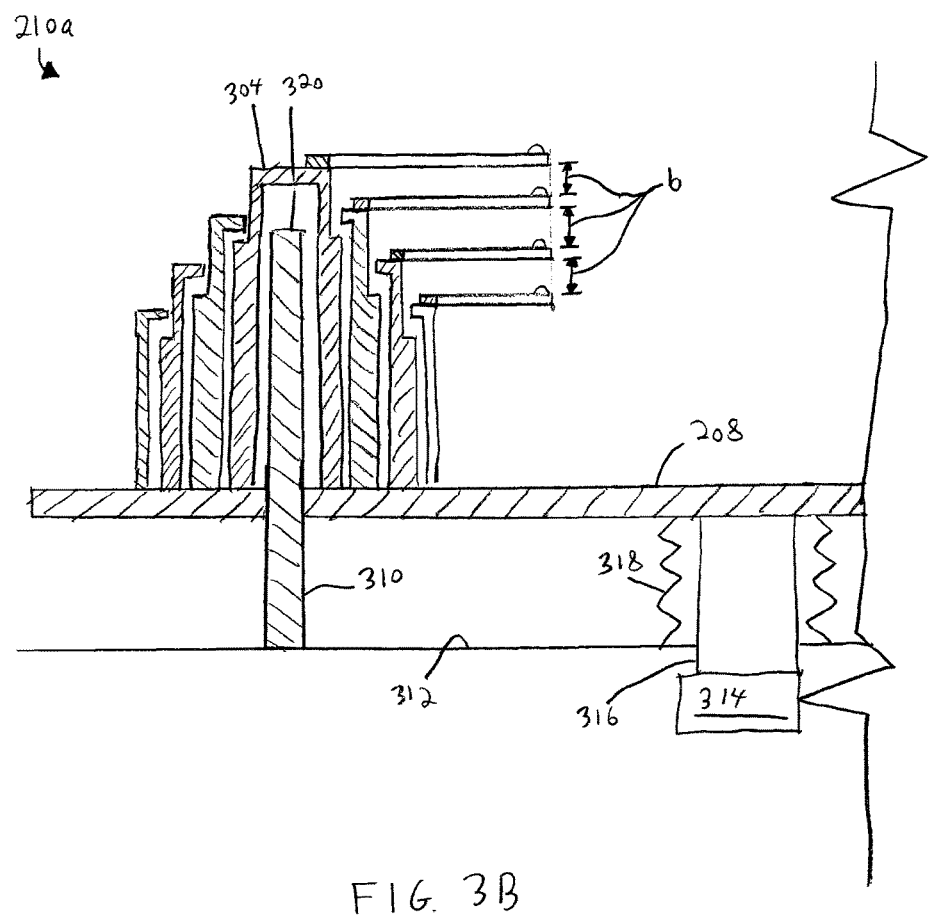
FIG. 3b is a cross-sectional view of a collapsible substrate support in a transfer position in accordance with some embodiments of the present disclosure.

FIGS. 3A and 3B illustrate cross-sectional views of the collapsible substrate support 206 in the processing position and the transfer position, respectively. Only one plurality of concentric tubular elements (hereinafter "the plurality of concentric tubular elements 210a") is depicted in FIGS. 3A and 3B for clarity. The following description also applies to the second plurality of concentric tubular elements 210b. The plurality of concentric tubular elements 210a includes an outermost tubular element $302_n$ coupled to the base 208, an innermost tubular element $302_1$, and a plurality of tubular elements $302_2$-$302_{n-1}$ disposed between the outermost tubular element $302_n$ and the innermost tubular element $302_1$. The innermost tubular element $302_1$ includes a continuous upper surface 304. The remaining tubular elements $302_2$-$302_n$ include respective openings through which a radially inwardly adjacent tubular element extends. Each tubular element radially outward of the innermost tubular element $302_1$ includes an inwardly extending collar 308 that overlaps with a shoulder 306 of a radially inward adjacent tubular element to prevent movement of the radially inward adjacent tubular element beyond the inwardly extending collar 308. A pin 310 coupled to the floor 312 of the batch processing apparatus 200 extends into the innermost tubular element $302_1$.

Each of the concentric tubular elements $302_1$-$302_n$ includes corresponding substrate support elements (i.e., support prongs 322) disposed on an upper surface to support a substrate (e.g., substrate 326 partially shown in uppermost position in FIG. 3A). A lowermost substrate support element is coupled to the outermost tubular element $302_n$. An uppermost substrate support element is couple to the innermost tubular element $302_1$. In some embodiments, each of the support prongs 322 includes contact elements 324 to reduce damage that may be caused to a backside of the substrate. In embodiments in which the batch processing apparatus 200 performs a heating process, the support prongs 322 may be formed of quartz or any other process compatible material transparent to microwaves emitted by the radiative heating element 216. In embodiments in which the batch processing apparatus 200 performs a cooling process, the support prongs 322 may be formed of a metal (e.g., aluminum) to improve cooling of the substrates. The contact elements 324 may be formed of any process-compatible material that reduces particle generation on the backside of the substrate. For example, the contact elements may be formed of $Al_2O_3$.

The collapsible substrate support 206 further includes a lift mechanism 314 coupled to the base 208 via a shaft 316 that extends through the floor 312 of the batch processing apparatus 200. Bellows 318 surround the shaft 316 and are coupled to the floor 312 and the base 208 to prevent a vacuum leak. The lift mechanism 314 moves the base 208 linearly between a first position and a second position, thus moving the collapsible substrate support 206 between a processing position (FIG. 3A) and a transfer position (FIG. 3B). In the processing position, the base 208 is in a lowermost position. As a result, the continuous upper surface 304 of the innermost tubular element $302_1$ rests on an upper surface 320 of the pin 310. Because the outermost tubular element $302_n$ is fixed to the base 208, the plurality of concentric tubular elements 210a acts similar to a telescope. In the expanded position (i.e., the processing position), each inwardly extending collar 308 rests on the radially inward adjacent shoulder 306. In the processing position, the support prongs 322 are spaced apart by a distance a. The distance a is process-dependent and is different for different processes.

FIG. 3B illustrates the transfer position of the collapsible substrate support 206. For clarity, only a few of the elements are labeled in FIG. 3B. However, all of the elements shown in FIG. 3B correspond to the elements labelled and described above with respect to FIG. 3A. In the transfer position, the lift mechanism 314 raises the base 208 so that all of the plurality of concentric tubular elements 210a rest on the base 208. In the retracted position (i.e., transfer position) the support prongs 322 are spaced apart by a distance b. The distance b is large enough so that the transfer robot 106 can extend between vertically adjacent support prongs 322 to place a substrate on one of the support prongs 322. For example, the distance b may be about 10 mm, which is standard spacing for front opening unified pods (FOUPs).

Returning to FIG. 1, the system controller 140 controls operation of the multi-chamber processing system 100 using a direct control of one or more of the processing platform 102 and factory interface 104 components (i.e., the process chambers 190A-E, transfer robot 106, etc.) or alternatively, by controlling the computers (or controllers) associated with the processing platform 102 and factory interface 104 components. The system controller 140 generally includes a central processing unit (CPU) 142, a memory 144, and support circuits 146. The CPU 142 may be one of any form of a general purpose computer processor that can be used in an industrial setting. The memory 144, or computer-readable medium, is accessible by the CPU 138 and may be one or more of readily available memory such as random access memory (RAM), read only memory (ROM), floppy disk, hard disk, or any other form of digital storage, local or remote. The support circuits 146 are conventionally coupled to the CPU 142 and may comprise cache, clock circuits, input/output subsystems, power supplies, and the like.

Although the above description is directed towards use of the inventive collapsible substrate support in a batch processing chamber, the collapsible substrate support may alternatively be used in other applications, such as, for example, in load lock chamber 184.

While the foregoing is directed to embodiments of the present disclosure, other and further embodiments of the disclosure may be devised without departing from the basic scope thereof.

The invention claimed is:

1. A collapsible substrate support for handling semiconductor substrates, comprising:
a base linearly moveable between a first position and a second position; and
a first plurality of substrate support elements coupled to the base and including a lowermost substrate support element disposed in a fixed position with respect to the base and an uppermost substrate support element disposed above the lowermost substrate support element, wherein the uppermost substrate support element is linearly movable between a first position nearer to the lowermost substrate support element and a second position further from the lowermost substrate support element, and wherein the uppermost substrate support element includes a shoulder that extends radially outwards and overlaps with a collar that extends radially inwards from an adjacent substrate support element.

2. The collapsible substrate support of claim 1, further comprising:
a second plurality of substrate support elements coupled to the base and including a lowermost substrate support element disposed in a fixed position with respect to the base and an uppermost substrate support element disposed above the lowermost substrate support element, wherein the uppermost substrate support element is linearly movable between a first position nearer to the lowermost substrate support element and a second position further from the lowermost substrate support element.

3. The collapsible substrate support of claim 2, wherein each of the first and second pluralities of substrate support elements is configured to support only one side of a substrate, and wherein the first and second pluralities of substrate support elements are disposed opposite each other such that corresponding pairs of first and second substrate support elements are configured to support a single substrate.

4. The collapsible substrate support of claim 1, wherein a distance between adjacent ones of the first plurality of substrate support elements is controlled by a position of the base.

5. The collapsible substrate support of claim 4, further comprising:
a first pin extending through the base to selectively control a position of the first plurality of substrate support elements based upon movement of the base with respect to the first pin.

6. The collapsible substrate support of claim 1, further comprising:
a first plurality of concentric tubular elements to support respective ones of the first plurality of substrate support elements.

7. A collapsible substrate support for handling semiconductor substrates, comprising:
a base coupled to a lift mechanism via a shaft extending through a floor of a batch processing chamber, wherein the base is moveable between a processing position and a transfer position;
a first plurality of concentric tubular elements, wherein a first outermost tubular element is coupled to the base, wherein each of the first plurality of concentric tubular elements radially inward of the first outermost tubular element extends through an adjacent one of the first plurality of concentric tubular elements, and wherein a first innermost tubular element includes a first continuous upper surface and a shoulder that extends radially outwards and overlaps with a collar that extends radially inwards from an adjacent first tubular element;
a second plurality of concentric tubular elements, wherein a second outermost tubular element is coupled to the base, wherein each of the second plurality of concentric tubular elements radially inward of the second outermost tubular element extends through an adjacent one of the second plurality of concentric tubular elements, and wherein a second innermost tubular element includes a second continuous upper surface and a shoulder that extends radially outwards and overlaps with a collar that extends radially inwards from an adjacent second tubular element;
a first pin extending through the base and into the first innermost tubular element; and
a second pin extending through the base and into the second innermost tubular element,
wherein each of the first and second pluralities of concentric tubular elements includes support prongs disposed on an upper surface to support a substrate.

8. The collapsible substrate support of claim 7, further comprising:
a plurality of contact elements disposed on each support prong to support a substrate.

9. The collapsible substrate support of claim 7, wherein, in the transfer position, a distance between vertically adjacent support prongs is less than the distance between vertically adjacent support prongs in the processing position.

10. The collapsible substrate support of claim 9, wherein, in the transfer position, a distance between vertically adjacent support prongs is about 10 mm.

11. The collapsible substrate support of claim 7, wherein the support prongs are formed of quartz or a metal.

12. The collapsible substrate support of claim 7, wherein each of the first and second pluralities of tubular elements radially outward of the first and second innermost tubular elements includes an inwardly extending collar that overlaps with a shoulder of a radially inward adjacent tubular element to prevent movement of the radially inward adjacent tubular element beyond the inwardly extending collar.

13. An apparatus for batch processing and handling of semiconductor substrates, comprising:
a body having a floor and sidewalls defining a processing volume; and
a collapsible substrate support disposed within the body, the collapsible substrate support comprising:
a base linearly moveable between a first position and a second position; and
a first plurality of substrate support elements coupled to the base and including a lowermost substrate support element disposed in a fixed position with respect to the base and an uppermost substrate support element disposed above the lowermost substrate support element, wherein the uppermost substrate support element is linearly movable between a first position nearer to the lowermost substrate support element and a second position further from the lowermost substrate support element, and wherein the uppermost substrate support element includes a shoulder that extends radially outwards and overlaps with a collar that extends radially inwards from an adjacent substrate support element.

14. The apparatus of claim 13, further comprising:
a first pin extending through the base to selectively control a position of the first plurality of substrate support elements based upon movement of the base with respect to the first pin.

15. The apparatus of claim 13, further comprising:
a radiative heat source to heat the processing volume.

16. The apparatus of claim 13, wherein the first plurality of substrate support elements are formed of one of quartz or a metal.

17. The apparatus of claim 13, further comprising:
a coolant source to supply a coolant to the collapsible substrate support.

18. The apparatus of claim 13, further comprising:
a plurality of contact elements disposed on each one of the first plurality of substrate support elements to support a substrate.

19. The apparatus of claim 13, wherein, in the first position, a distance between vertically adjacent ones of the first plurality of substrate support elements is less than the distance between vertically adjacent support prongs in the second position.

20. The apparatus of claim 13, further comprising:
an opening in one of the sidewalls through which a transfer robot extends to transfer a substrate to or from one of the first plurality of substrate support elements aligned with the opening.

\* \* \* \* \*